United States Patent [19]
Ota et al.

[11] Patent Number: 5,118,953
[45] Date of Patent: Jun. 2, 1992

[54] SUBSTRATE ALIGNMENT APPARATUS USING DIFFRACTED AND REFLECTED RADIATION BEAMS

[75] Inventors: Kazuya Ota, Tokyo; Nobutaka Magome, Kawasaki; Hideo Mizutani, Yokohama; Kouichiro Komatsu, Tokyo, all of Japan

[73] Assignee: Nikon Corporation, Tokyo, Japan

[21] Appl. No.: 528,244

[22] Filed: May 24, 1990

[30] Foreign Application Priority Data

May 30, 1989 [JP] Japan .................. 1-137176

[51] Int. Cl.⁵ ............................ G01B 11/26
[52] U.S. Cl. ................... 250/548; 356/401
[58] Field of Search ............. 250/548, 557, 561; 356/363, 399–401

[56] References Cited

U.S. PATENT DOCUMENTS

| | | | |
|---|---|---|---|
| 4,656,347 | 4/1987 | Une et al. | 250/548 |
| 4,668,089 | 5/1987 | Oshida et al. | 250/548 |
| 5,004,348 | 4/1991 | Magome | 356/401 |

FOREIGN PATENT DOCUMENTS 63-283129  5/1987  Japan .

Primary Examiner—David C. Nelms
Assistant Examiner—Stephone B. Allen
Attorney, Agent, or Firm—Shapiro and Shapiro

[57] ABSTRACT

An alignment apparatus is provided with a first beam receiving device arranged to receive an interference beam which is produced at a diffraction grating of a substrate as a result of illumination with a pair of beams which intersect each other on the substrate, and a second beam receiving device arranged to receive a reference beam which is produced by the interference between regularly reflected beams of the pair of beams occurring on the substrate, wherein the positional offset of the substrate is obtained on the basis of a comparison between the output signal of the first beam receiving device and the output signal of the second beam receiving device. Since a beam transmitting path for transmitting a measurement beam is substantially common to a beam transmitting path for a reference beam, even if the fluctuations of air occur, both the measurement beam and the reference beam substantially equally reflect the influence of the fluctuations, whereby it is possible to cancel the same.

11 Claims, 8 Drawing Sheets

FIG. 8a
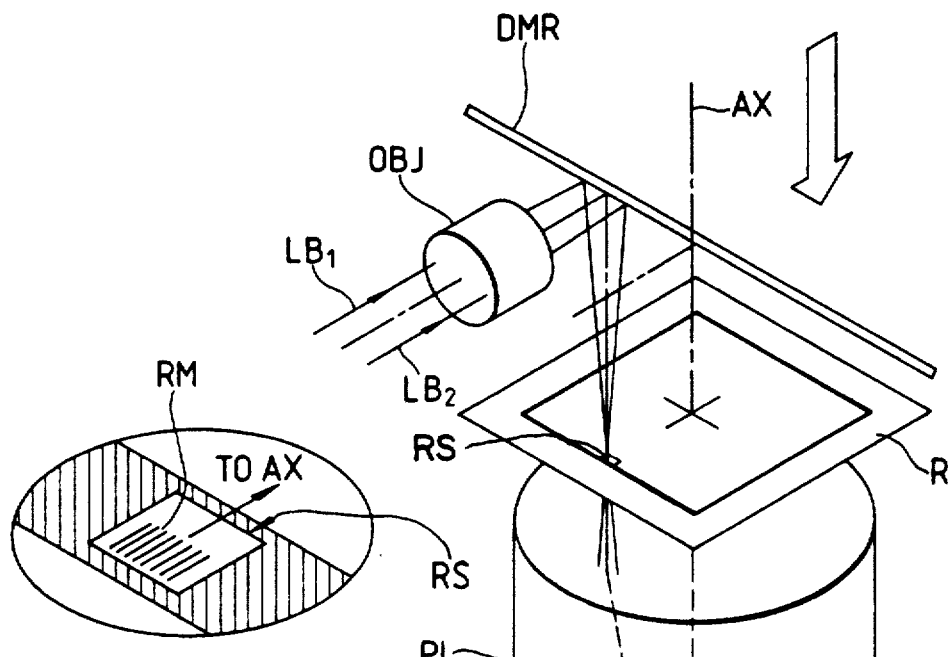
FIG. 8b
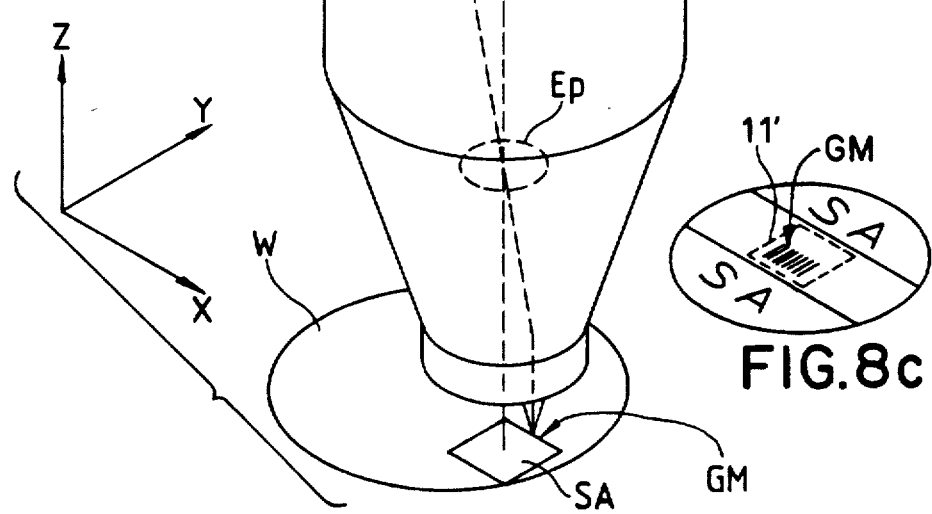
FIG. 8c

SUBSTRATE ALIGNMENT APPARATUS USING DIFFRACTED AND REFLECTED RADIATION BEAMS

BACKGROUND OF THE INVENTION

1. Field of the Invention

The present invention relates to an alignment apparatus provided with a sensor capable of detecting the position of an object at a resolution of the order of nanometers and, more particularly, to an aligment apparatus suitable for use with an exposure system for manufacturing semiconductor devices.

2. Related Background Art

In the field of optical lithography, the wavelength of a laser source for use in printing the pattern of a mask on a wafer, that is, an exposure wavelength, has recently been made shorter and shorter. With the development of a projection lens having an improved numerical aperture (N.A.), the mimimim resolvable linewidth has reached the order of submicrons, for example, 0.5–0.7 μm. If a pattern which requires such a high resolution is to be transferred in practice, it is necessary that the matching accuracy of a pattern formed on a wafer with respect to a new mask pattern image be made high so as to meet the aforesaid resolution. As one method of improving the matching accuracy, it is proposed to improve the accuracy with which an alignment mark is detected, that is, resolution.

A number of techniques have recently been published for detecting the position of a mark at a resolution of the order of nanometers. One technique utilizes a method which comprises the steps of illuminating a diffraction grating formed on a substrate, such as a wafer, with a pair of coherent collimated beams in two different directions, producing one-dimensional interference fringes on the diffraction grating, and photo-electrically detecting the intensity of a diffracted beam or an interference beam which is produced at the diffraction grating as a result of illumination with the interference fringes. A heterodyne method is also known in which a pair of coherent beams having slightly different frequencies illuminate a diffraction grating in a manner similar to the above-described one and an interference beam to be photo-electrically detected is intensity-modulated at a beat frequency.

More specifically, the heterodyne method is to detect the positional offset within ±¼ pitch of the diffaraction mark by obtaining the phase difference within ±180° between the photo-electric signal of a measurement-purpose interference beat beam coming from the diffraction mark on the wafer and the photo-electric signal of a reference-purpose interference beat beam. The photo-electric signal of the reference-purpose interference beat beam is separately produced from the aforesaid pair of coherent beams.

For example, if the diffraction pitch P of the diffraction grating mark on the wafer is 2 μm, that is, the diffraction pitch P includes a 1-μm line and a 1-μm space, the resolution of phase-difference measurement is approximately 1.5°. The resolution of measurement of positional offset is:

$$P/4 \cdot (0.5°/180°) \approx 0.0014 \ \mu m = 1.4 \ nm$$

This resolution is extremely high for an alignment sensor for detecting optical information from the diffraction mark. With the current electronic techniques, it is of course possible to accommodate the resolution and accuracy of the measurement of phase difference within 0.1°. Accordingly, if a more accurate phase-difference detecting circuit or arithmethic software is employed, a fivefold resolution, that is, 0.28 nm, can be easily achieved. If a positional offset detecting system utilizing the aforesaid interference fringes is incorporated as an alignment system, such as a proximity aligner, a stepper, a mirror projection arrangment, a step-scan aligner or the like, the matching accuracy is expected to improve at least one digit with respect to conventional alignment systems.

One example in which such a heterodyne interference alignment system is incorporated in a projection exposure system, that is, a stepper, is disclosed in Japanese Patent Laid-Open No. 63-283129, which corresponds to U.S. Ser. No. 536,939 filed Jun. 12, 1990 (now U.S. Pat. No. 5,004,348 issued Apr. 2, 1991), which is a continuation application of U.S. Ser. No. 469,713 filed Jan. 24, 1990 (now abandoned), which is a continuation application of U.S. Ser. No. 192,784 filed May 10, 1988 (now abandoned). The disclosed example utilizes the various contrivances of more effectively using the heterodyne alignment system within a stepper. The primary features of the disclosed art are: (1) that a reticle mark and the diffraction grating of a wafer can be simultaneously detected by means of non-exposure wavelengths in a through-the-reticle (TTR) system; and (2) that it is possible to consistently monitor the positional offset of a mark by the heterodyne alignment system even during the exposure of the wafer by means of a dichroic mirror disposed above the reticle.

However, the aforesaid prior art has the following problems.

The aforesaid measurement-purpose interference beat beam and reference-purpose interference beat beam are produced from the same laser beam. That is to say, a pair of coherent beams is produced from the aforesaid laser beam. These two coherent beams respectively reach the diffraction grating of the wafer by way of a reticle supported on the stepper and a projection lens assembly. The measurement-purpose beat beam coming from the diffraction grating of the wafer returns through the projection lens assembly and the reticle, and is photo-electrically detected to thereby produce the photo-electric signal of the measurement-purpose interference beat beam. In the meantime, each of the aforesaid coherent beams is partially separated, and the separated components are transmitted to a detector by way of a reference diffraction grating and are photo-electrically detected to thereby produce the photo-electric signal of the reference-purpose interference beat beam.

More specifically, a beam transmitting path for the pair of beams which results in the reference-purpose beat beams completely differs from a beam transmitting path for the pair of beams which results in the measurement-purpose beat beam. In addition, the optical path length travelled by the pair of beams which illuminate the wafer exceeds 100 cm, even when measured from the branch point between a measurement-purpose beam receiving system and a reference-purpose beam receiving system. In particular, when the fluctuation of air occurs midway along the optical path from the reticle to the wafer, the interference fringes formed on the wafer are influenced, thus resulting in a lowering in the accuracy of detection of positional offset, imperfect alignment, or the like.

SUMMARY OF THE INVENTION

It is accordingly an object of the present invention to provide an alignment apparatus which can utilize interference fringes to achieve a higher detection accuracy than those of conventional arrangements.

It is another object of the present invention to provide an interference-fringe type position detecting system having a structure which can prevent the lowering of detection accuracy due to the positional drift of a pair of coherent beams for producing interference fringes, which drift occurs at a source of the coherent beams, or due to the fluctuation of air in a beam transmitting path for the pair of beams.

To achieve the above objects, according to the present invention, there is provided an alignment apparatus which includes first beam receiving means for receiving as a measurement beam an interference beam coming from a diffraction grating formed on a substrate, and second beam receiving means for receiving a reference beam which is produced as a result of the interference between the regularly reflected beams of a pair of beams produced on the substrate. The positional offset of the substrate is obtained on the basis of a comparison between the output signal of the first beam receiving means and the output signal of the second beam receiving means.

In the alignment apparatus according to the present invention, a beam transmitting path for transmitting a pair of beams from which a measurement beam is produced is substantially common to a beam transmitting path for transmitting a pair of beams from which a reference beam is produced. Accordingly, even if the fluctuations of air occur, both the measurement beam and the reference beam substantially equally reflect the influence of the fluctuations, thereby cancelling the same. Also, since a measurement beam receiving system and a reference beam receiving system may be disposed spatially close to each other, the influences of the fluctuations of air upon the respective measurement and reference beams can be made substantially equal.

In addition, since, in essence, the regularly reflected beams coming from the diffraction grating do not contain information on the displacement of the diffraction grating, those beams can be used as reference beams.

The above and other objects, features and advantages of the present invention will be apparent from the following description of preferred embodiments of the invention with reference to the accompanying drawings.

BRIEF DESCRIPTION OF THE DRAWINGS

FIG. 8a is a schematic perspective view showing the arrangement of a projection exposure system according to a third embodiment of the present invention, and FIG. 8b and 8c are perspective views of details;

DESCRIPTION OF THE PREFERRED EMBODIMENTS

Preferred embodiments of the present invention will be described in detail below with reference to the accompanying drawings.

The following is an explanation of a first embodiment of the present invention.

Figure 1:
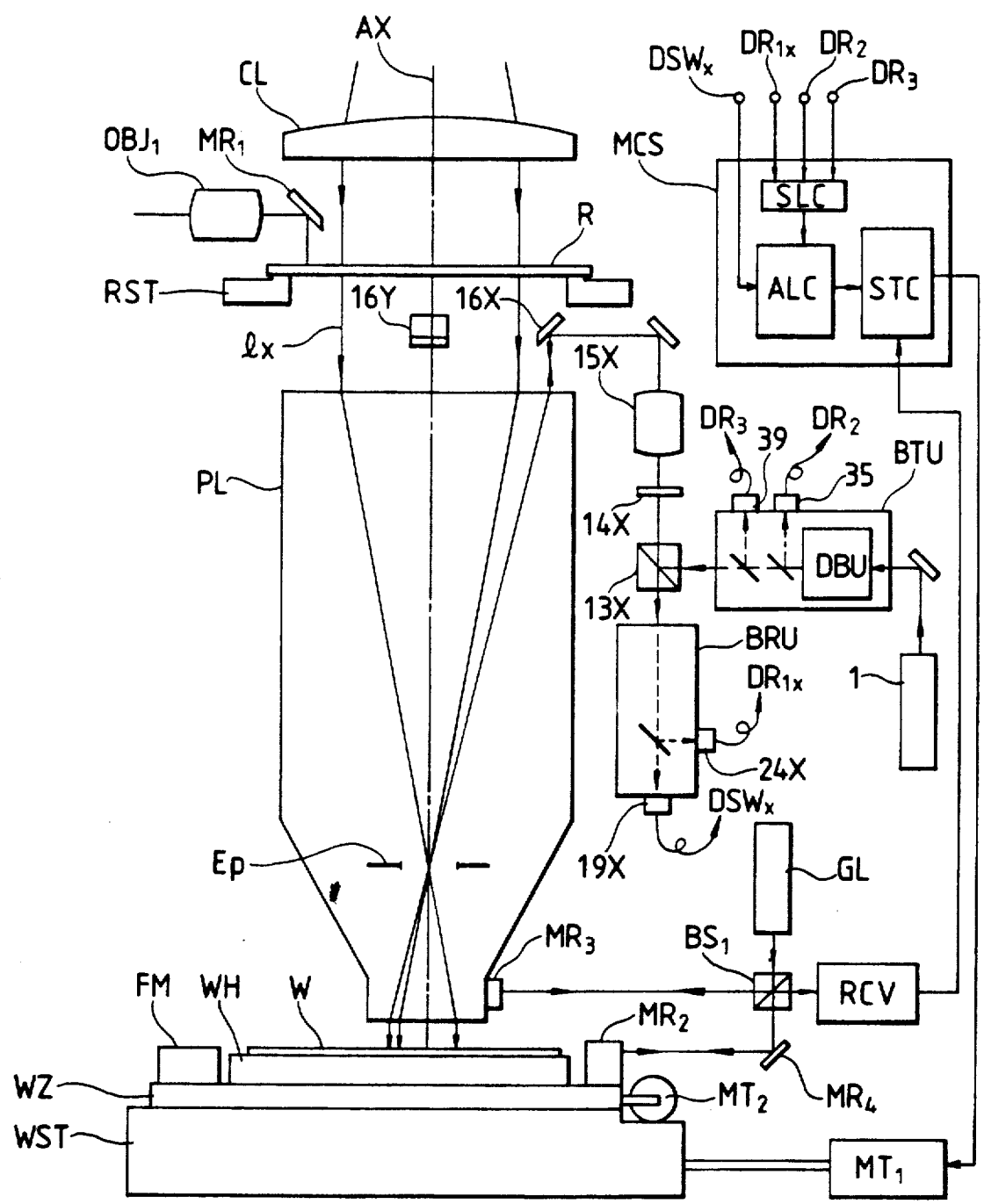
FIG. 1 is a block diagram schematically showing a projection exposure system according to a first embodiment of the present invention.

Referring to FIG. 1, exposure light supplied from a source of light is transmitted through an illumination optical system including a fly-eye lens (not shown) to illuminate a reticle R as light having a uniform intensity distribution. The reticle R is held on a reticle stage RST which is displaceable by slight distances in the respective X, Y and θ directions.

A mirror MR1 and an objective lens OBJ1 which constitute a reticle alignment system is used to detect a mark provided on the peripheral portion of the reticle R and position the reticle R in alignment with the optical axis AX of a projection lens assembly PL which exhibit telecentric optical characteristics at its opposite ends. A circuit pattern formed on the reticle R is projected onto a wafer W on a reduced scale by the projection lens assembly PL. An image of the source of exposure light, in this example, an image in the exit plane of the fly-eye lens, is formed on either the entrance pupil of the projection lens assembly PL or the exit pupil EP of the same.

The wafer W is retained on a wafer holder WH by vacuum, and the wafer holder WH is held on a Z stage WZ which is displaceable by a slight distance along the optical axis AX. The Z stage WZ is held on an XY stage WST which is displaceable at a stroke of some tens of millimeters in the X- and Y-directions. A fiducial mark plate FM and a movable mirror MR2 associated with a length measuring arrangement of the laser interference type are fixed to a part of the Z stage WZ in such a manner that the top surfaces of the mark plate FM and the movable mirror MR2 are approximately flush with the exposing surface of the wafer W.

The laser length measuring arrangement includes a frequency stabilizing laser source GL, a beam splitter BS1, a mirror MR4 and a receiver RCV. A laser beam emitted from the laser source GL is directed to both the movable mirror MR2 and a reference mirror MR3, fixed to a part of the barrel of the projection lens assembly PL, by way of the beam splitter BS1. Light reflected from the mirrors MR2 and MR3 is conducted into the receiver RCV, where variations in the fringe of the reflected light are counted. The count of the receiver RCV is fed to a stage controller STC provided in a main control system MCS, where it is translated into the coordinate position of the XY stage WST.

In the aforesaid arrangement, l x represents a principal ray positioned on the outermost side of the exposure light. The mirror MR1 is disposed outwardly of the principal ray l x so that it does not intercept the exposure light. Although the objective lens OBJ1 and the mirror MR1 are disposed as illustrated, the wafer W positioned in a projecting image plane or a mark formed on the fiducial mark plate FM can be observed through a transparent portion of the reticle R and the projection lens assembly PL.

An alignment optical system is arranged to detect optical information conducted from the wafer W through the projection lens assembly PL only. As can be seen from FIG. 1, mirrors 16X and 16Y are fixed outwardly of the maximum availabel pattern exposure region defined between the reticle R and the projection lens assembly PL, i.e., a rectangular region inscribed in a circular projecting image field, and observation is possible through the mirrors 16X and 16Y.

The objective side of the alignment optical system includes an objective lens 15X, a quarter wavelength plate 14X, a polarizing beam splitter 13X, and the like. To produce a pair of laser beam for alignment purposed, a laser source 1, such as a He-Ne laser, an Ar ion laser or a He-Cd laser, are also disposed. A laser beam emitted from the laser source 1 is transformed into a pair of linear polarized beams having predetermined different frequencies by a beam transmitting unit BTU including a frequency shifter DBU. This pair of beams is reflected by the polarizing beam splitter 13X, then circularly polarized through the quarter wavelength plate 14X, the objective lens 15X and the mirror 16X, and then projected so as to pass through the center of the entrance pupil EP of the projection lens assembly PL.

The laser source 1 emits a pair of beams each having a wavelength which lies in a long wavelength band which does not substantially sensitize a photoresist. A conjugate plane relative to the wafer W is positioned between the mirror 16X and the objective lens 15X, and the pair of beams form collimated beams which intersect each other at a predetermined angle in the conjugate plane.

The position of intersection of the pair of beams is selected in a plane substantially perpendicular to the surface of the sheet of FIG. 1. Accordingly, the pair of beams intersects each other at a predetermined angle on the wafer W and, if a diffraction grating mark is present within a region illuminated by the intersecting beams, an interference beat beam is produced substantially perpendicularly.

The interference beat beam is conducted in the projection lens assembly PL along the symmetrical axes of the aforesaid pair of beams in the reverse direction, reflected by the mirror 16X, transmitted through the objective lens 15X, the quarter wavelength plate 14X and the beam splitter 13X, and incident upon a beam receiving unit BRU.

The beam receiving unit BRU is provided with a photo-electric element 19X for receiving a measurement-purpose interference beat beam coming from the diffraction grating mark on the wafer W, and a photo-electric element 24X for receiving a reference-purpose interference beat beam obtained by the interference between light beams regularly reflected from the wafer W. In the present invention, the photo-electric element 19X corresponds to a first light receiving means, while the photo-electric element 24X corresponds to a second light receiving means.

Both a signal DSWX supplied from the photo-electric element 19X and a signal DR1X supplied from the photo-electric element 24X are sinusoidal waves each having a beat frequency. The signals DSWX and DR1X are inputted to a phase-difference detector ALC incorporated in the main control system MCS. The phase-difference detector ALC obtains the phase difference between the signals DSWX and DR1X, and information indicative of an offset distance corresponding to the phase difference is supplied to the stage controller STC for the purpose of controlling a motor MT1.

In a general heterodyne arrangement, another high-accuracy prealignment sensor is used to detect a diffraction grating mark to be measured, and it is necessary to position the wafer W within $\pm \theta$ of a grating pitch P. The positioning using such a prealignment sensor may be accomplished by detecting a prealignment mark on a wafer or shifting the XY stage WST with reference to the laser length measuring device RCV.

As described above, the reference-purpose interference beat beam is produced in the beam transmitting unit BTU, and the first embodiment is provided with photo-electric elements 35 and 39 for converting such light into reference signals. A selector SLC is incorporated in the main control system MCS for the purpose of selecting the desired reference signal. The selector SLC selects the desired reference signal from among the reference signal DR1X supplied from the photo-electric element 24X, the reference signal DR2 supplied from the photo-electric element 35 and the reference signal DR3 supplied from the photo-electric element 39, and transmits the selected reference signal to the phase-difference detector ALC. The reference signal DR1X is used in a normal aligning operation, while the reference signal DR2 or DR3 is used in checking various other conditions as required.

The following is an explanation of the relationship between the pair of beams and the interference beat beam coming from the diffraction grating mark.

Figure 2:
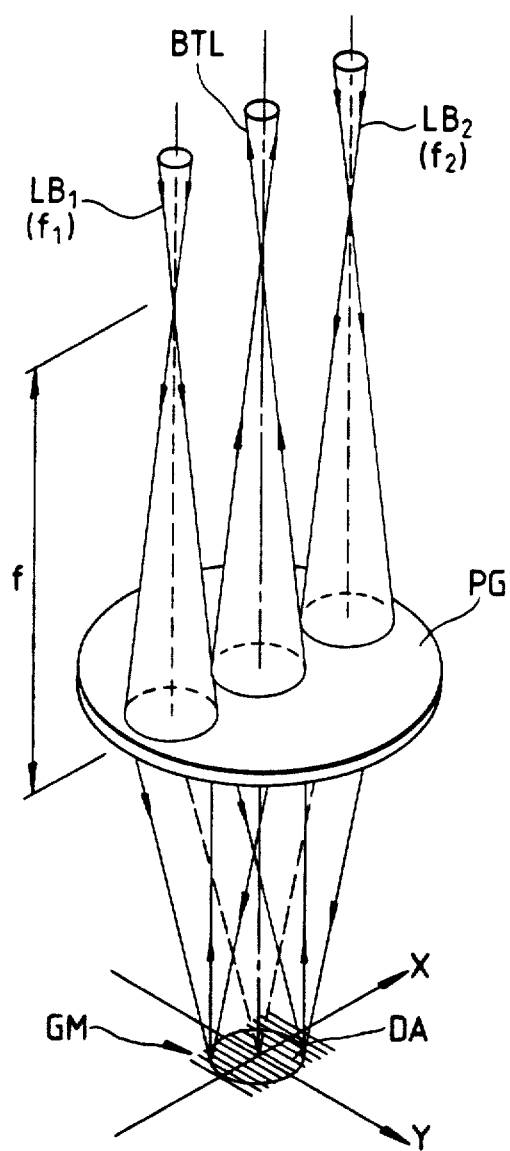
FIG. 2 is a perspective view schematically showing the principle of the present invention.

FIG. 2 shows a lens system PG which forms a part of the projecting lens assembly PL on the wafer side, and the pupil EP is located at the position of the front focal length f. A beam LB1 (frequency $f_1$) and a beam LB2 (frequency $f_2$) are respectively converged to form spots at locations which are in point symmetry with respect to the center of the pupil EP. After this convergence, the principal rays, shown by dashed line, of the respective beams LB1 and LB2 are made incident on the lens system PG in parallel with each other. Then, the beams LB1 and LB2 exit from the lens system PG as collimated beams and intersect each other at the grating mark GM on the wafer W. In an area where the beam LB1 and LB2 intersect each other, interference fringes, the pitch of which is determined by an intersection angle $2\theta$ and a beam wavelength $\lambda$, are formed to extend in the Y-direction. The interference fringes flow in the pitch direction, i.e., in the X-direction, at a velocity corresponding to the beat frequency.

Figure 3:
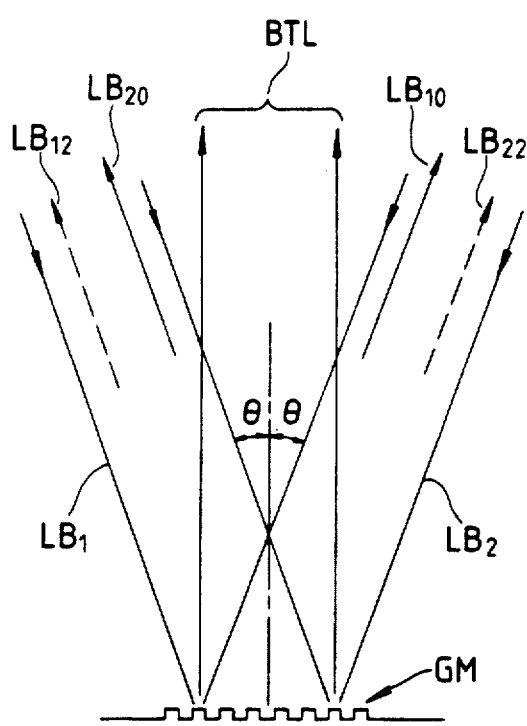
FIG. 3 is an optical-path diagram showing the manner in which diffracted light is produced at a diffraction grating.

As shown in FIG. 3, if the pitch direction of the grating mark GM is made to coincide with the X direction and the angle of incidence $\theta$ is selected to meet the relationship $\sin \theta = n \cdot \lambda / P$ ($n = 1, 2, 3, \ldots$), an interference beat beam BTL is produced which substantially perpendicular returns from the grating mark GM to the lens system PG, where P represent the pitch of the mark GM and θ represents the angle of incidence of each of the beams LB1 and LB2 on the wafer W. If n=1 and the beat of first-order diffracted light is considered, the first-order light produced at the grating mark GM as the result of illumination with the beam LB1 and the first-order light produced at the grating mark GM as the result of illumination with the beam LB2 are coaxially combined to interfere with each other, thereby forming the interference beat beam BTL.

The intereference beat beam BTL is conducted as a substantially collimated beam from the wafer W to the lens system PG and, after passing through the lens system PG, is converged to form a spot at the center of the pupil EP. As can be seen from the above explanation of the lens system PG, the beams LB1, LB2 and the interference beat beam BTL form, in a pupil space, convergent and divergent laser beams each having principal rays which are parallel to each other, and, in an image space, collimated beams each having principal rays which intersect each other at the rear focus position of the lens system PG.

A regularly reflected beam LB10 of the beam LB1, produced at the wafer W, follows an optical path which is the same as that of the beam LB2, and travels in the same state as, but in the direction opposite to, the beam LB2. A regularly reflected beam LB20 of the beam LB2, produced at the wafer W, similarly travels in the direction opposite to the beam LB1. If the grating mark GM is present within an area DA illuminated by the beams LB1 and LB2, a low-level second-order light LB12, produced at the grating mark GM by illumination with the beam LB1, travels in the direction opposite to the direction in which the beam LB1 is transmitted, and may interfere with the regularly reflected beam LB20. Similarly, a low-level second-order light LB22, produced at the grating mark GM by illumination with the beam LB2, travels in the direction opposite to the direction in which the beam LB2 is transmitted, and may interfere with the regularly reflected beam LB10.

In the first embodiment, the two regularly reflected beam LB10 and LB20 are returned to the beam receiving unit BRU of FIG. 1, and are used as reference beams.

The structure of the alignment system will be explained in detail with reference to FIG. 4.

A beam emitted from the laser source 1, such as a He-Ne laser having a wavelength of 633 nm, is incident on a half wavelength plate PH, and the direction of polarization of the beam is inclined by 45 degrees by the half wavelength plate PH. The beam is then incident on a polarizing beam splitter 2 and divided into an S-polarized beam LBS and a P-polarized beam LBP. The beam LBP is reflected by a mirror 3A and made incident on an acousto-optical modulator (AOM) 4A serving as a frequency shifter, while the beam LBS is incident on the AOM 4B. The AOM 4A modulates the beam LBP in accordance with a high-frequency drive signal SF1 having, for example, a frequency $f_0$ (some tens of MHz), while the AOM 4B modulates the beam LBS in accordance with a high-frequency drive signal SF2 having, for example, a frequency $f_0 + \Delta f$ ($\Delta f = f_1 - f_2$), where $\Delta f$ is a beat frequency of the order of several KHz to some tens of KHz. Each of the AOMs 4A and 4B includes a stopper for a zero-order beam, and is arranged to pass only a first-order diffracted beam which is generated at the angle of diffraction determined by the frequency $f_0$.

The P-polarized beam LBP1 (frequency $f_1$) modulated by the AOM 4A is substantially perpendicularly incident on the bottom face of an amplitude-dividing beam splitter 6 through a lens 5A. The S-polarized beam LBS2 (frequency $f_2$) exiting from the AOM 4B is made substantially perpendicularly incident on a side face of the beam splitter 6 by means of a mirror 3B and the lens 5A. The two beams LBP1 and LBP2 exit from the top face of the beam splitter 6 in such a manner that their principal rays are parallel to and spaced apart from each other by a predetermined distance. The beams LBP1 and LBP2 are reflected by mirrors 7A and 7B and incident on a half wavelength plate 8. The half wavelength plate 8 inclines the plane of polarization of each of the beams LBP1 and LBP2 by 45 degrees. In turn, a polarizing beam splitter 9, which follows the half wavelength plate 8, divides the beam LBP1 into the S-polarized beam LBS1 and the P-polarized beam LBP1 in a vectorial manner, and the beam LBS2 into the S-polarized beam LBS2 and the P-polarized beam LBP2 in a similar manner.

The beams LBS1 and LBS2 reflected by the polarizing beam splitter 9 is transmitted to a beam splitter 12 along an optical path formed by a lens 10A, a mirror 10C, an illumination field stop (rectangular aperture) 11 and a lens 10B.

The lenses 10A and 10B serve as a relay system, and the two beams LBS1 and LBS2 intersect each other in the field stop 11. The space between the lenses 10A and 10B forms an image space, and the field stop 11 is disposed in conjugate relation to the wafer W. The beams LBS1 and LBS2 are collimated beams.

The beam splitter 12 divides the respective beams LBS1 and LBS2 into a beam for transmission to an X-direction objective system and a beam for transmission to a Y-direction objective system. Since the X-direction and Y-direction objective systems of the beam splitter 12 have the same arrangements, the arrangement of the X-direction objective system only will be explained below.

The beams LBS1 and LBS2 transmitted through the beam splitter 12 are approximately 100% reflected by the polarizing beam splitter 13X and circularly polarized in the same direction by the quarter wavelength plate 14X. The circularly polarized beams are formed, by the objective lens 15X, into a pair of beams LB1 and LB2 which intersect each other at a predetermined angle in a space near the mirror 16X, and are then made incident on the marginal portion of the projection lens assembly PL by means of the mirror 16X. The beams LB1 and LB2 are incident on the projection lens assembly PL with an inclination symmetrical with respect to a Y-Z plane which includes the optical axis AX of the projection lens assembly PL and the optical axis AX-x of the objective lens 15X, and intersect each other on the wafer W at a predetermined angle.

In the above-described arrangement, the surface of the wafer W is made conjugate to the rear focus plane of the objective lens 15X (the point of intersection of the beams LB1 and LB2 in the vicinity of the mirror 16X) by the projection lens assembly PL. The surface of the wafer W is also made conjugate to the field stop 11 by the objective lens 15X and the lens 10B. In addition, the field stop 11 is made approximately conjugate to the diffraction points of the AOMs 4A and 4B by the respective lenses 5A and 5B.

A front focal plane EPX of the objective lens 15X is conjugate to the pupil EP of the projection lens assembly PL, and is also made conjugate to a plane EPb located between the mirrors 7A and 7B by the lenses 10B and 10A. Accordingly, if the beams LBP1 and LBS1, which exit from the AOMs 4A and 4B as collimated beams, are focused to form spots in the plane EPb by the respective lenses 5A and 5B, it follows that the beams LB1 and LB2 which reach the wafer surface are collimated beams. By adjusting, for example, the distance between the spots of the respective beams LBP1 and LBP2 in the plane EPb, the intersection angle $2\theta$ shown in FIG. 3 can be set to a predetermined value.

When an aperture image of the field stop 11 is formed on the wafer W and the grating mark GM is positioned in the relation shown in FIG. 2, the interference beat beam ($\pm$ first-order light) BTL is produced. The interference beat beam BTL passes through the center of the pupil EP of the projection lens assembly PL and is transmitted to the polarizing beam splitter 13X by way of the mirror 16X, the objective lens 15X and the quarter wavelength plate 14X. Because the projection lens assembly PL is telecentric, the interference beat beam BTL is conducted along the optical axis AX-x of the objective lens 15X and converted into P-polarized light by passing through the quarter wavelength plate 14X. The P-polarized light is transmitted through the polarizing beam splitter 13X and a beam splitter 17X. Thereafter, the light is received by a photo-electric element 19X through a transparent slit plate 18X. The transparent slit plate 18X is disposed at a position conjugate to the front focal plane of the objective lens 15X, that is, the pupil EP, so that it blocks the regularly reflected beams LB10 and LB20 coming from the wafer W while transmitting on-axis interference beat beam BTLX.

The regularly reflected beams LB10 and LB20 coming from the grating mark GM or the surface of the wafer W travel along the optical axes of the respective beams LB1 and LB2 in the opposite direction, transformed into P-polarized beams by the quarter wavelength plate 14X, and transmitted through the polarizing beam splitter 13X. Light reflected by the beam splitter 17X reaches a selectively blocking slit plate 20X. The selectively blocking slit plate 20X is disposed at a location conjugate to the pupil EP and serves to block the interference beat beam BTLX travelling along the optical axis while transmitting the regularly reflected beams LB10 and LB20. A lens 21X, whose front focal plane positionally corresponds to the selectively blocking slit plate 20X, collimates the regularly reflected beams LB10 and LB20 and causes the collimated beams to intersect each other on a reference grating plate 22X at a predetermined angle. The reference grating plate 22X is provided with a transmissive grating lattice which primarily corresponds to the grating mark GM on the wafer W. The grating pitch of the reference grating plate 22X is selected to be M.K times the pitch P of the grating mark GM, where 1/M represents the reduction ratio of the projecting lens arrangement PL and K represent the magnification of an image determined by the objective lens 15X and the lens 21X.

Since the regularly reflected beams LB10 and LB20 are identical polarized beams, interference fringes which flow at a velocity corresponding to the beat frequency are formed on the reference grating plate 22X, thereby producing zero-order transmitted light and an interference beat beam which travels coaxially to the optical axis of the lens 21X. The interference beat beam is separated from the zero-order transmitted light by means of the transparent slit plate 23X, and received by the photo-electric element 24X. In the first embodiment, the interference beat beam which has passed through the reference grating plate 22X serves as reference light.

In the above-described arrangement, the reference grating plate 22X is made conjugate to the wafer W by means of the lens 21X, the objective lens 15X and the projection lens assembly PL.

The foregoing is an explanation of the arrangement of the X-direction alignment system. Similarly, a Y-direction alignment system comprises the mirror 16Y, an objective lens 15Y, a quarter wavelength plate 14Y, the polarizing beam splitter 13Y, a beam splitter 17Y, a transparent slit plate 18Y, a photo-electric element 19Y, a selectively blocking slit plate 20Y, a lens 21Y, a reference grating plate 22Y, a transparent slit plate 23Y, and a photo-electric element 24Y. In the drawing, AX-Y denotes the optical axis of the objective lens 15Y, EPY denotes the front focal plane of the objective lens 15Y (a plane conjugate to the pupil EP), BTLY denotes the interference beat beam coming from the Y-direction grating mark GM formed on the wafer W, DSWY denotes a measurement signal supplied from the photo-electric element 19Y, and DR1Y denotes a reference signal supplied from the photo-electric element 24Y.

The phase-difference detector ALC of FIG. 1 preferably includes two identical circuits so that phases relative to the X- and Y-directions can be independently measured. However, in an arrangement in which a mark-detecting operation relative to the X-direction and that relative to the Y-direction do not overlap in time throughout an alignment sequence, the number of circuits may be one.

The phase-difference detector ALC detects the phase difference between the signal DSWX and the signal DR1X with respect to the X-direction, and the phase difference between the signal DSWY and the signal DR1Y with respect to the Y-direction.

In the first embodiment, the beam transmitting unit BTU is arranged so that reference light can also be produced in the beam transmitting unit BTU. First reference light is produced by utilizing two beams LBP1 and LBS2 exiting from one side of the beam splitter 6.

The beams LBP1 and LBS2 exiting from one face of the beam splitter 6 are separated from each other by the polarizing beam splitter 30 in accordance with their respective directions of polarization. The P-polarized beam LBP1 is transmitted through the polarizing beam splitter 30, reflected by a mirror 31A, converter into an S-polarized beam (frequency $f_1$) by a polarizing element 32 for changing the direction of polarization into a substantially perpendicular direction and made incident on the top face of a beam splitter 33.

In the meantime, the S-polarized beam LBS2 is reflected by the polarizing beam splitter 30, then reflected by a mirror 31B, and then made incident on one face of the beam splitter 33. The beam splitter 33 serves to coaxially combine these two beams (frequencies $f_1$ and $f_2$), which coincide with each other with respect to the direction of polarization, and provide interference between them. The interference beam thus obtained is transmitted through a lens 34 and received by a photo-electric element 35. The photo-electric element 35 produces a reference signal DR2 of the beat frequency. The lens 34 serves to convert the beams converged by the lenses 5A and 5B into collimated beams, but, since the numerical apertures (N.A.) of the respective beams are extremely small, the lens 34 may be omitted.

Second reference light is produced at the polarizing beam splitter 9. The P-polarized beams LBP1 and LBP2, passed through the half wavelength plate 8, are transmitted through the polarizing beam splitter 9. The P-polarized beams LBP1 and LBP2 are made to intersect each other on a reference grating plate 37 by a lens 36. Only an interference beat beam transmitted through the plate 37 is extracted by a transparent slit plate 38. A photo-electric element 39 receives the extracted interference beat beam to produce the reference signal DR3 of the beat frequency.

The operation of the first embodiment will be explained below in brief.

Since the stepper of FIG. 1 is of a step-and-repeat type, a multiplicity of shot areas are formed on the wafer W and the diffraction grating marks GM is formed in correspondence with each shot area.

The XY stage WST is moved under the control of the laser length measuring device RCV to position the XY stage EST within $\pm \frac{1}{4}$ of the pitch P of the grating mark GM. The phase-difference detector ALC measures the phase difference between the reference signal DR1X and the measurement signal DSWX and the phase difference between the reference signal DS1Y and the measurement signal DSWY, thereby providing the deviation (within $\pm P/4$) of the current stop position of the XY stage WST from the desired alignment position thereof. The above operation is performed with respect to every shot area on the wafer W or a number of representative shot areas. Exposures of the pattern of the reticle R is performed while superposing the pattern of the reticle R on each shot area by establishing the correspondence between the coordinate system of the array of the short areas and the moving coordinate system of the XY stage WST defined by the laser length measuring device RCV.

The foregoing is an explanation of a basic mark-detecting operation. However, like the prior art, either of the reference signals DR2 and DR3 may be used as a reference signal by utilizing the switching operation of the selector SLC.

For example, a grating mark, which has the same pitch as the grating mark GM formed on the wafer W, is formed on the fiducial mark FM. This grating mark is positioned vertically below the projection lens assembly PL, and each signal waveform of the measurement signal DSW and the reference signals DR1, DR2 (or DR3) if fetched into a waveform memory for a predetermined period only. Then, the phase difference $\Delta\phi_1$ between the measurement signal DSW and the reference signal DR1 and the phase difference $\Delta\phi_2$ between the measurement signal DSW and reference signal DR2 are obtained. Although the two phase differences should be equal to each other in principle, they actually take on slightly different values due to various factors such as the difference between the influences of fluctuations of air, the difference between element structures in the corresponding optical paths, and the difference between the states of preservation of the respective planes of polarization.

The value $\Delta\phi_1 - \Delta\phi_1$ is stored as an offset amount. Accordingly, the reference signal DR2 (or DR3) is used as a reference signal during the measurement of a grating mark of a device and, for the detection of phase difference, the extent of positional offset may be obtained by taking into account the stored offset amount.

In addition, the stability of the optical path of the alignment optical system (from the wafer W to the laser source 1 or from the wafer W to each photo-electric element) can be checked by using the fiducial mark plate FM. For example, exposure light is continuously or intermittently projected with a test reticle or the like being mounted, and the exposure light which has passed through the reticle pattern is passed through the projection lens assembly PL. Simultaneously, the part of the reflecting surface of the fiducial mark plate FM which excludes the fiducial mark is placed within the area DA illuminated by the beams LB1 and LB2, and the phase difference between the reference signal DR1 and the reference signal DR2 (or DR3) is examined for a long time. The variation of the phase difference is plotted with time. In this manner, it is possible to examine the thermal stability of the alignment optical path, particularly from the beam splitter 13 to the wafer W, in a state close to actual exposure.

Figure 5:
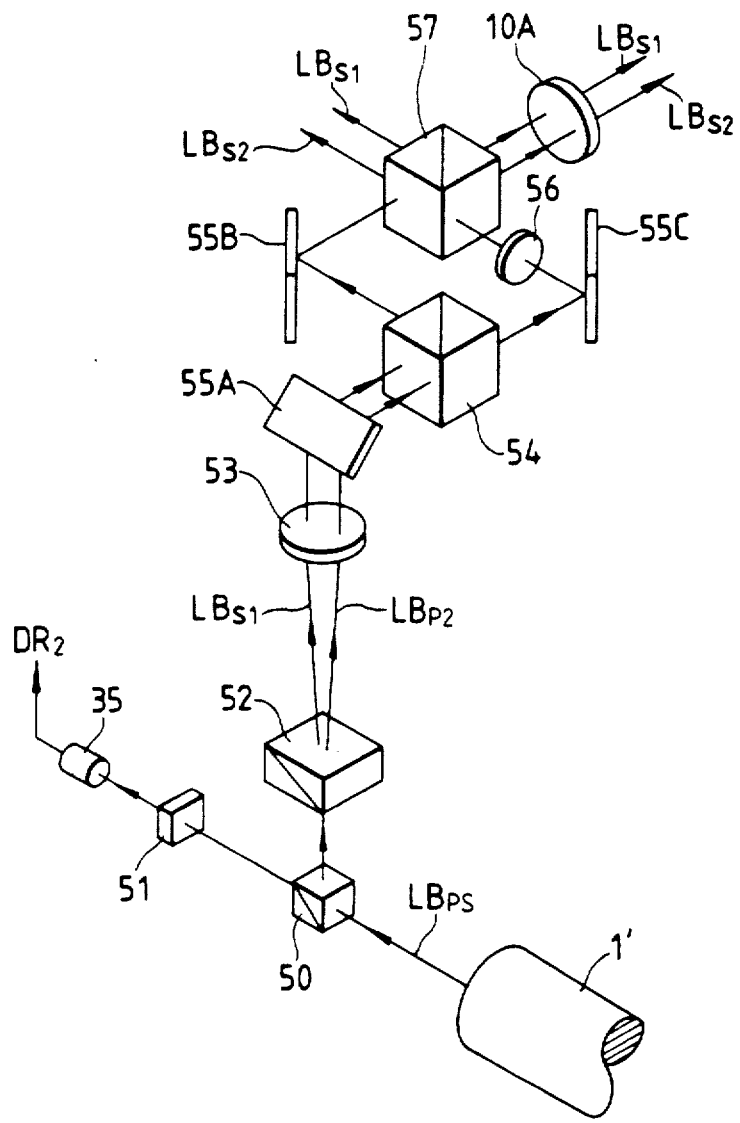
FIG. 5 is a schematic perspective view showing a modification of a beam transmission system in the first embodiment.

The arrangement of the above-described beam transmitting unit BTU and the system for producing the reference signal may be of the type shown in FIG. 5.

Referring to FIG. 5, a Zeeman Laser source 1' generates beams LBPS of two different frequencies whose directions of polarization are substantially perpendicular to each other. The beams LBPS are divided by a beam splitter 50, and a transmitted part is converted into an interference beat beam by a phase plate 51 and received by a photo-electric element 35. The photo-electric element 35 provides the reference signal DR2 having a frequency corresponding to the difference between the aforesaid two frequencies.

The portion of the beam LBPS reflected by the beam splitter 50 is incident on a Wallastone prism 52 and divided into the beams LBS1 and LBP2 which travel in different directions on the basis of the difference between their directions of polarization. The Wallastone prism is disposed at a location conjugate to the wafer W, and the angle of separation at the Wallastone prism corresponds to the angle of intersection of the beams LB1 and LB2 on the grating mark GM. The beams LBS1 and LBP2 are refracted by a lens 53 so that their principal rays are parallel to each other, and are made incident on a polarizing beam splitter 54 by a mirror 55A. The S-polarized beam LBS1 (frequency $f_1$) is reflected by the polarizing beam splitter 54 and made incident on a beam splitter (half mirror) 57 by way of a mirror 55B.

The P-polarized beam LBP2 (frequency $f_2$) transmitted through the polarizing beam splitter 54 is made incident on the beam splitter 57 by way of a mirror 55C and a half wavelength plate 56. The beam LBP2 is converted into an S-polarized beam LBS2 by the half wavelength plate 56. The two beams LBS1 and LBS2 are eccentrically combined in the beam splitter 57 so that they are incident on the lens 10A with their principal rays parallel to each other (refer to FIG. 4). The beams LBS1 and LBS2 which are combined as mutually parallel beams exit from another face of the beam splitter 57, and they are conducted to a reference light receiving system which comprises the lens 36, the reference grating 37, the transparent slit plate 38, and the photo-electric element 39 as shown in FIG. 4.

In the above-described arrangement, beams of two different beams can be produced without the use of special devices such as AOMs, the construction of the beam transmitting unit BTU can be simplified. In addition, since the difference between the two frequencies obtainable from the a Zeeman laser source 1' is relatively large (on the order of MHz), the accuracy of measurement of a phase difference can be improved.

Figure 4:
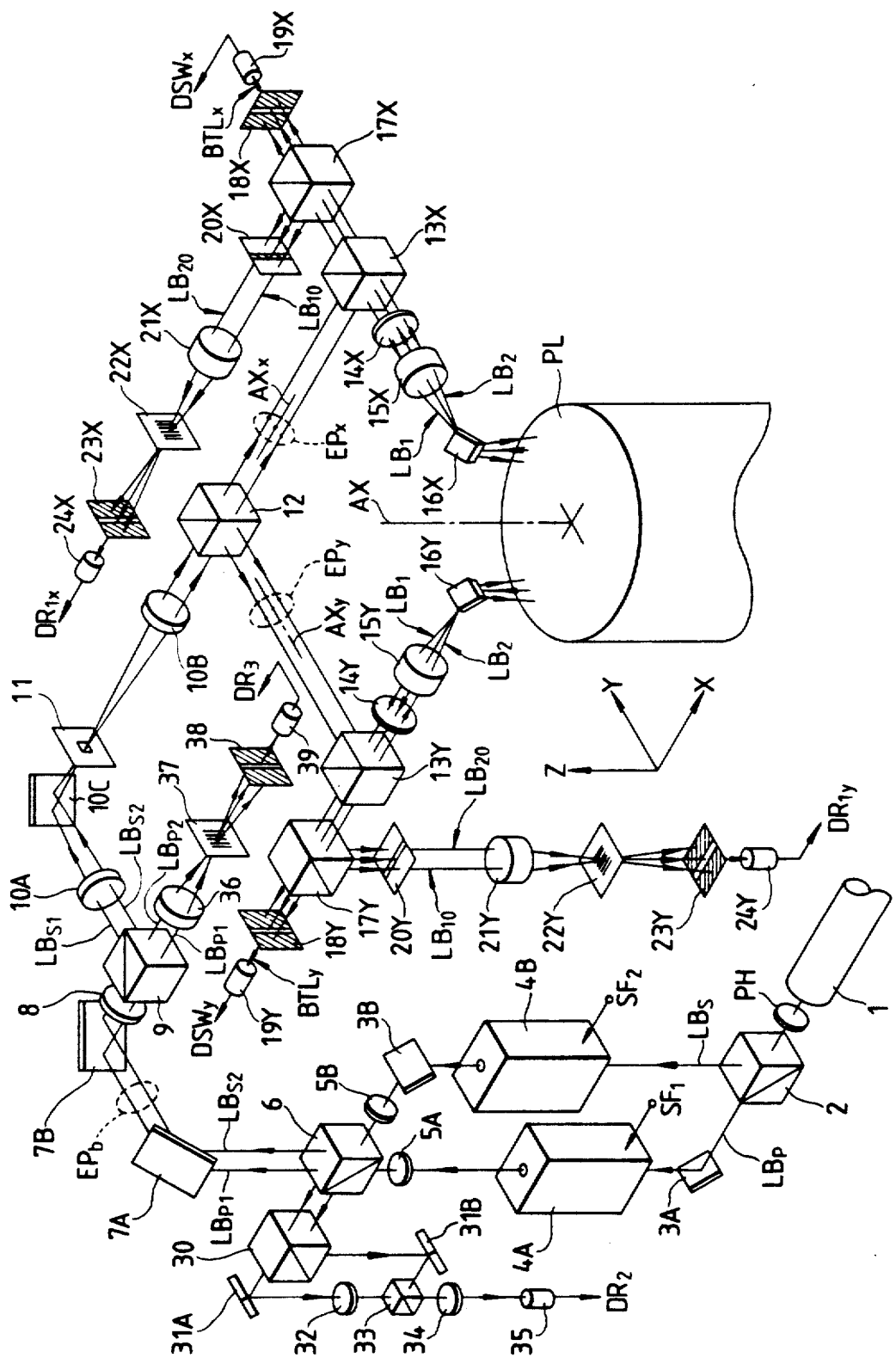
FIG. 4 is a diagrammatic perspective view showing the essential portion of an alignment system in the first embodiment.

In the arrangement shown in FIG. 5, since the angle of intersection of the beams LB1 and LB2 is primarily determine by the Wallastone prism 52, the angle of intersection of the beams LB1 and LB2 or the telecentricity thereof is only adjustable with a limited range as compared to the arrangement shown in FIG. 4. A transmissive-type grating plate may be used in place of the Wallastone prism 52 so that a zero-order transmitted light is blocked and only ± first-order light is utilized as a pair of beams. In this arrangement as well, the angle of intersection of the pair of beams is primarily determined by the pitch of the grating plate and the degree of freedom of adjustment is still limited.

Figures 6A, 6B:
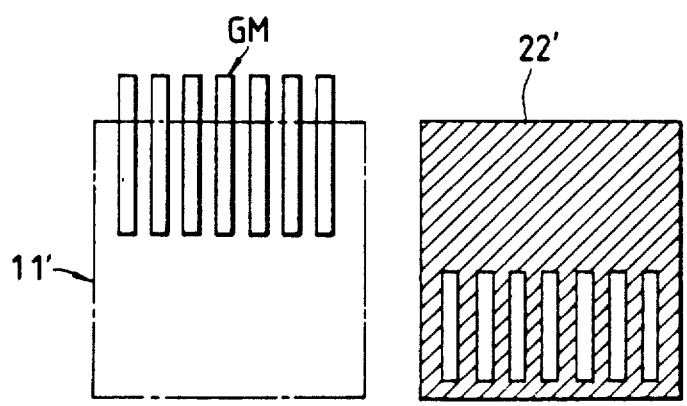
FIG. 6A is a schematic view which serves to illustrate the manner in which a diffraction grating mark is detected in the first embodiment.
FIG. 6B is a plan view showing one example of a reference grating in the first embodiment.

Another mark-detecting method will be explained with reference to FIGS. 6A and 6B. Although the arrangement shown in FIG. 4 or 5 may be utilized, the reference grating plates 22X and 22Y in the reference light receiving system utilizing regularly reflected light as shown in FIG. 4 are configured as shown in FIG. 6B. As illustrated, a reference grating plate 22' includes two halves which are separated in a direction substantially perpendicular to the pitch direction (or measurement direction), and a grating part is formed in one half, while the other half is formed as a blocking part. The grating mark GM on the wafer W is detected in the following manner. As shown in FIG. 6A, the field stop 11 forms an image 11' on the wafer W at a location which is offset from the grating mark GM to a small extent in a direction substantially perpendicular to the direction of grating pitch. As shown, one half of the image 11' overlaps a part of the grating mark GM, while the other half overlaps a reflecting part surrounding the grating mark GM. Since the reference grating plate 22' is conjugate to the wafer W, the regularly reflected beams LB10 and and LB20 coming from the grating mark GM on the wafer W are completely cut off by the blocking portion of the reference grating plate 22', while the regularly reflected beams LB10 and LB20 coming from the reflecting part surrounding the grating mark GM are allowed to intersect each other at the grating portion of the reference grating plate 22'. Thus, interference fringes resulting from the interference between the regularly reflected beams LB10 and LB20 flow on the grating portion of the reference grating plate 22'. The pitch of the interference fringes is approximately half that of the grating of the reference grating plate 22'.

In the above-described arrangement, as explained in connection with FIG. 3, the second-order diffracted light LB22 and LB12 coming from the grating mark GM does not enter and interfere with the regularly reflected beams LB10 and LB20 as explained in connection with FIG. 3. Accordingly, it is possible to produce a reference signal having improved accuracy (pureness).

A second embodiment of the present invention will be explained below with reference to FIG. 7. The second embodiment is suitable for use with an off-axis wafer alignment system which is fixed to a position outward of a projection lens assembly or a proximity-type mask.wafer alignment system. The basic arrangement of the second embodiment is the same as that of the first embodiment except that a pair of beams which illuminate a grating mark on a substrate in two different directions is a pair of complementarily polarized beams, for example, a pair of linearly polarized beams which substantially perpendicularly intersect each other or a pair of circularly polarized beams whose displacement vectors rotate in opposite directions. The first and second embodiments also differ from each other in terms of how to produce photo-electric signals.

Figure 7:
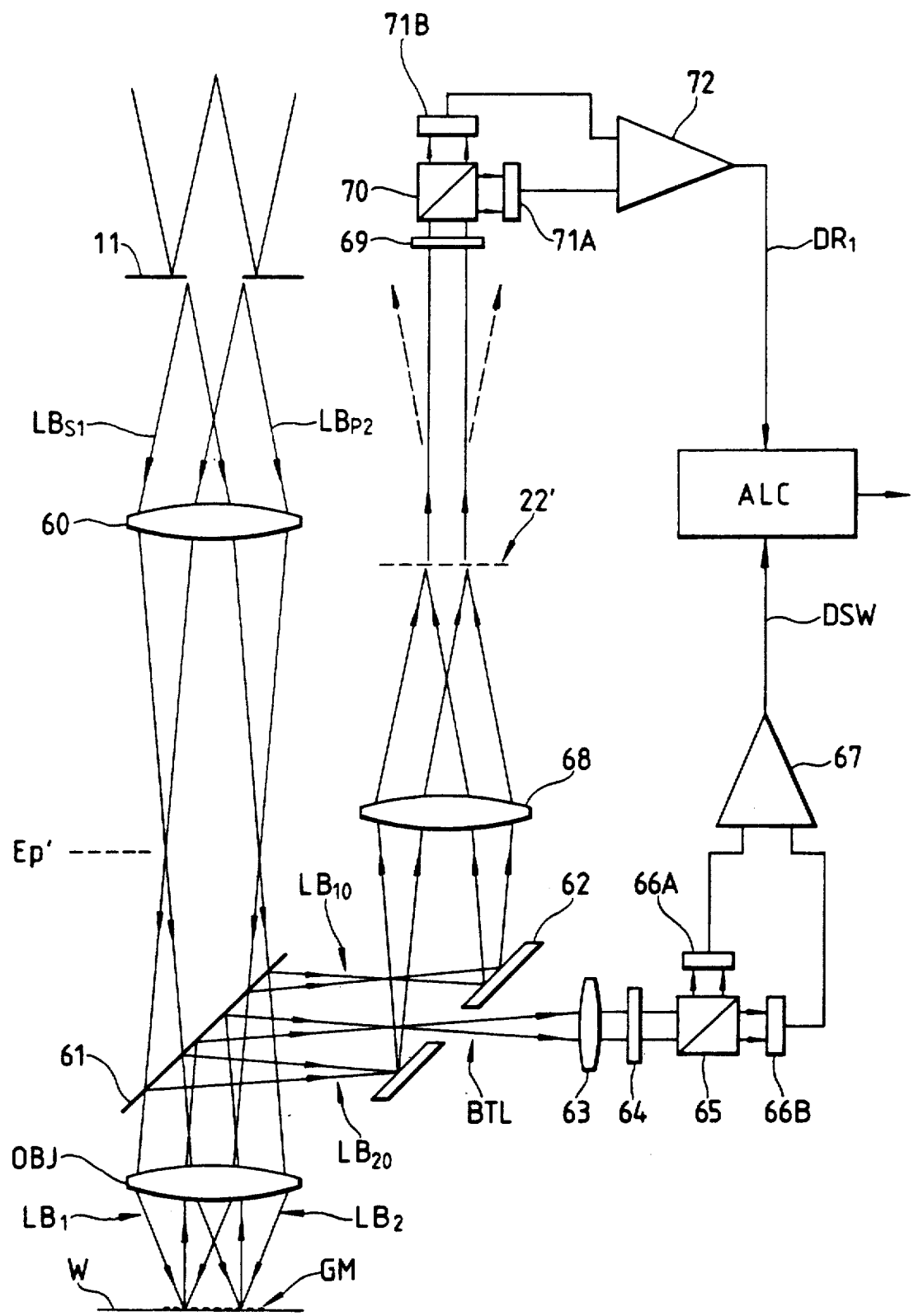
FIG. 7 is an optical-path view showing the arrangement of a position detecting device according to a second embodiment of the present invention.

Referring to FIG. 7, the two parallel beams LBS1 and LBP2 which have passed through the field stop 11 are linearly polarized beams which substantially perpendicularly intersect each other, and a frequency difference $\Delta f$ is present therebetween. The principal rays of the respective beams LBS1 and LBP2 are made paralled by a lens 60 and converted to form spots in a pupil Ep' of an objective lens OBJ. The beams LBS1 and LBP2 pass through a beam splitter 61 and are incident on the objective lens OBJ. A pair of parallel beams LB1 and LB2, which intersect each other at a predetermined angle, exit from the objective lens OBJ and illuminate the grating mark GM on the wafer W. The field stop 11 is conjugate to the grating mark GM, and it is preferable that the field stop 11 and the grating mark GM be disposed to assume the positional relationship shown in FIG. 6A.

The direction of polarization of a first-order diffracted beam which is produced in a direction substantially perpendicular to the grating mark GM as a result of the illumination by the beam LB1 differs from the direction of polarization of a first-order diffracted beam which is produced in a direction substantially perpendicular to the grating mark GM as a result of the illumination by the beam LB2. Accordingly, both first-order diffracted beams are transmitted, without any interference, to a reflecting mirror 62 having a central transparent slit by way of the objective lens OBJ and the beam spitter 61. These first-order diffracted beams BTL pass through the center of a reflecting mirror 62 which is inclined by 45 degrees with respect to the optical axis. After being collimated by a lens 63, the first-order diffracted beams BTL are transmitted to a polarizing beam splitter 65 through a half wavelength plate 64 for rotating the plane of polarization by 45 degrees. The polarization beam splitter 65 vectorially divides an S-polarized beam ($f_1$) and a P-polarized beam ($f_2$) exiting from the half wavelength plate 64, thereby producing an interference beat beam composed of the same polarized beam components. A photo-electric element 66B receives an interference beat beam resulting from an S-polarized beam component ($f_2$) made from the P-polarized beam ($f_2$) and the original S-polarized beam ($f_1$). A photo-electric element 66A receives an interference beat beam resulting from the P-polarized beam component ($f_1$) made from the S-polarized beam ($f_1$) and the original P-polarized beam ($f_2$).

The arrangement and operation of the half wavelength plate 64 and the polarizing beam splitter 65 are substantially the same as those of the half wavelength plate 8 and the polarizing beam splitter 9 both of which are shown in FIG. 4.

The photo-electric signals output from the photo-electric elements 66A and 66B are amplified by a differential amplifier 67 and the measurement signal DSW is produced. The signal output from the photo-electric element 66A (an AC signal of frequency $\Delta f$) and the signal output from the photo-electric element 66B (an AC signal of frequency $\Delta f$) are exactly reversed in phase. Accordingly, it is advantageous to compute these signals by means of the differential amplifier 67 in that the signal amplitude becomes twice with in-phase noise cancelled.

In the meantime, the P-polarized regularly reflected beam LB20 and the S-polarized regularly reflected beam LB10 are reflected by the reflecting mirror 62 disposed close to the pupil plane of the optical system, collimated by a lens 68, and caused to intersect each other at a predetermined angle on the reference grating plating 22', which is the same as that shown in FIG. 6B. The reference grating plate 22' is conjugate to the wafer W. The first-order diffracted beams travel from the reference grating plate 22' along the optical axis without interfering with each other, but a half wavelength plate 69 and a polarizing beam splitter 70 converts those beams into beat beams which interfere with each other. The beat beam of the S-polarized beam is received by a photo-electric element 71A, while the beat beam of the P-polarized beam is received by a photo-electric element 71B. The signals output from the photo-electric elements 71A and 71B are opposite in phase, and a differential amplifier 72 amplifies these signals to produce the reference signal DR1.

In the second embodiment described above, it is possible to detect positional offsetting similar to the aforesaid one without producing interference fringes on the grating mark.

In addition, since the differential amplifiers 67 and 72 can be used to amplify a signal in a push-pull manner, an extremely high S/N ratio can be achieved. Accordingly, the phase-difference detector ALC can measure the phase difference at an improved accuracy. The above-described technique of converting the pair of beams LB1 and LB2 which illuminate the grating mark into complementary polarized beams can also be applied to the first embodiment.

Furthermore, the present invention is similarly applicable to an alignment system for directly aligning a reticle to a wafer by using a grating mark on the reticle and a grating mark on the wafer.

In this case, as shown in FIG. 8a as a third embodiment, the objective lens OBJ having a two-focus element is used to illuminate the grating mark GM (see FIG. 8c) on the wafer W with one pair of beams LB1 and LB2 through a window RS (see FIG. 8b) of the reticle R and the projection lens assembly PL. A dichroic mirror DMR for separating the wavelength of exposure light and those of the beams LB1, LB2 is preferably disposed above the reticle R.

The circuit pattern area of the reticle R is surrounded by a light blocking zone having a predetermined width. The window (or transparent portion) RS is formed in the circuit pattern area, and a one-dimensional grating mark RM is formed on a half of the window RS. The grating mark GM is formed at a corresponding position in a street line (approximately 50-100 μm in width) which surrounds each shot area SA on the wafer W. The aperture image of the field stop 11 disposed in the beam transmitting unit BTU of the pair of beams LB1 and LB2 is defined to be slightly smaller than the window RS of the reticle R, and is formed on the street line as the aperture image 11'.

In the above-described TTR method of detecting the mark RM of the reticle R and the mark GM of the wafer W at the same time, even if the alignment system of FIG. 4 is used, it may be difficult to perform satisfactory separation since interference beat beams perpendicularly reflected from the respective marks are combined with one another in the pupil plane and the pupil-conjugate plane of the system. For this reason, as disclosed in the aforesaid prior art, the two-focus element (crystal lens) formed integrally with the objective lens OBJ converts the beams LB1 and LB2 to be transmitted to the window RS of the reticle R into complementarily polarized components. An aperture conjugate to the grating mark RM and an aperture conjugate to the grating mark GM are disposed in the beam receiving unit BRU so that, after an interference beat beam coming from the mark RM and an interference beat beam coming from the mark GM have been focused and separated, these beat beams are separately subjected to photo-electric detection.

A beam regularly reflected from the mark RM and a beam regularly reflected from the mark GM may be produced by using an arrangement similar to that shown in FIG. 4. In addition, apertures can be disposed in conjugate relation to the mark RM and the mark GM, respectively, so that the interference beat beams from the respective marks RM and GM have been focused and separated, the regularly reflected beams LB10 and LB20 are extracted and projected onto the reference grating plate 22 or 22'.

In such a TTR system, it is basically sufficient to measure the phase difference between the photo-electric signal of the interference beat beam coming from the mark RM of the reticle R and the photo-electric signal of the interference beat beam coming from the mark GM. However, if the influence of the fluctuation of air in the optical path from the reticle R to the wafer W is to be reduced, it may be preferable that a reference signal be produced from the regularly reflected beams LB10 and LB20 coming from the wafer W to detect the positional offset between the marks RM and GM.

The description of each embodiment refers to the method of producing a reference signal by using the reference grating plate 37 disposed in the beam transmitting unit BTU of the pair of beams LB1 and LB2 and the method of producing a reference signal by coaxially combining two beams and directly obtaining beats. In the method of producing a reference signal by coaxially combining two beams and directly obtaining beats (the method utilizing the photo-electric element 35 shown in FIG. 4 or 5), if the position of a beam exiting from the laser source 1 drifts for a certain reason, or if the exit angles of the beams frequency-modulated by the respective AOMs 4A and 4B slightly drift due to the temperature characteristics thereof, the phase component of the obtained reference signal DR2 does not vary, but the phase component of the measurement signal DSW coming from the photo-electric element 19 varies. Accordingly, an error occurs in the detection of a mark position detection due to the drift of the exiting beams.

In contrast, if the reference grating plate 37 is employed, the phase component of the reference signal DR3 varies due to the drift of the beam, thereby providing the effect of cancelling variations in the phase component of the measurement signal DSW. Accordingly, detection errors due to beam drifts can be substantially ignored.

Accordingly, it is preferable to produce an interference beat beam by employing the reference grating plate 22 or 22' and utilize the interference beat beam as a reference signal without directly coaxially combining the regularly reflected beams LB10 and LB20 coming from the wafer W and making them interfere with each other.

In another method of providing a frequency difference between two beams, a radial grating plate having a radially formed grating is rotated at high speed, and + first-order diffracted light and − first-order diffracted light may be utilized as one pair of beams.

Figure 9:
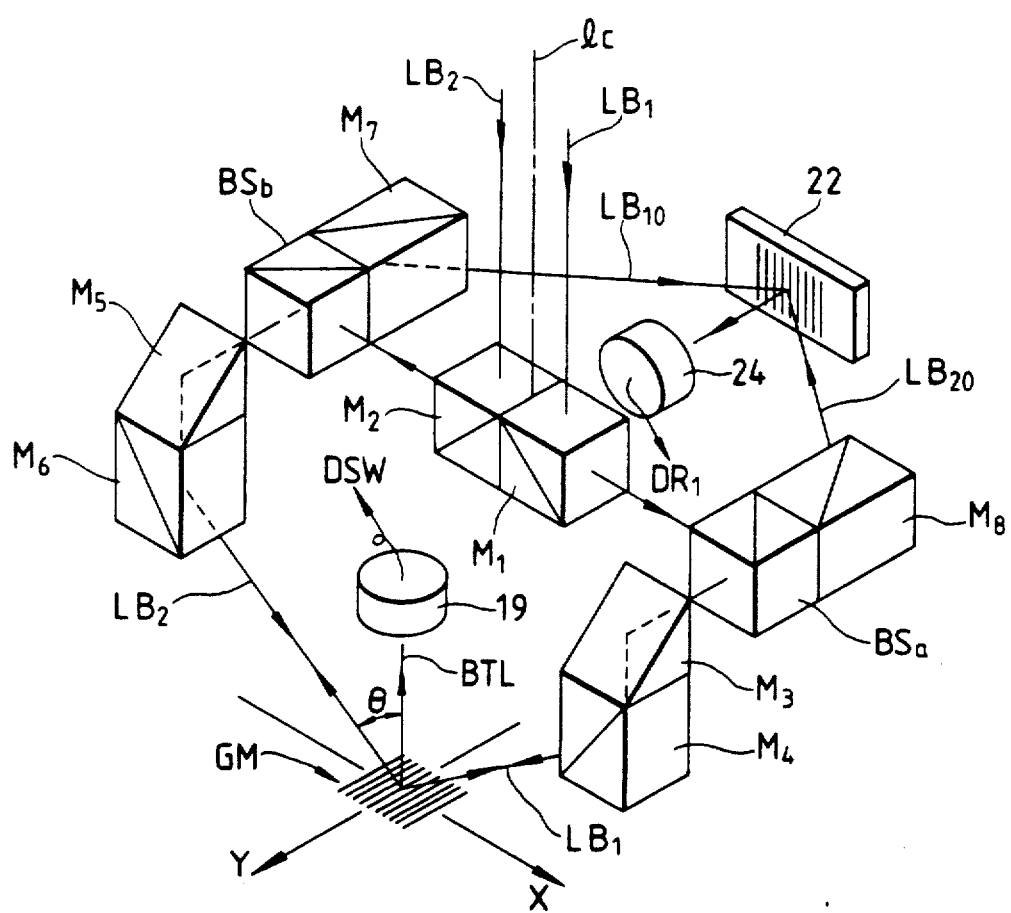
FIG. 9 is a schematic perspective view showing the arrangement of a position detecting device according to a fourth embodiment of the present invention.

FIG. 9 is a perspective view showing the arrangement of a positional offset detecting apparatus according to a fourth embodiment of the present invention.

The system of FIG. 9 is a symmetric arrangement which is symmetrical in the X-direction with respect to a vertical center line l c in the structure of the system.

The beams LB1 and LB2 each having a frequency $\Delta f$ which are spaced apart from each other in the X-direction with respect to the center line l c are reflected in the X-direction by mirrors M1 and M2, respectively. The beam LB1 is reflected by a beam splitter BSa in the Y-direction and illuminates the grating mark GM on an object from obliquely above in the X-direction by way of mirrors M3 and M4. In the meantime, the beam LB2 reflected by the mirror M2 is reflected by a beam splitter BSb in the Y-direction and illuminates the grating mark GM symmetrically with respect to the beam LB1 by way of mirror M5 and M6 from obliquely above in the X-direction. The pitch direction of the grating mark GM is the X-direction, and the interference beat beam BTL of a ± third-order interference beat beam coming from the grating mark GM is received by the photoelectric element 19 to provide the measurement signal DSW.

The regularly reflected beam LB10 coming from the grating mark GM follows an optical path opposite to that of the beam LB2, that is, passes an optical path formed by the mirrors M6 and M5 and the beam splitter MSb, and is reflected by a mirror M7 to obliquely illuminate the reference grating plate 22. Similarly, the regularly reflected beam LB20 coming from the object passes the optical path formed by the mirrors M4 and M3 and the beam splitter BSa, and is reflected by a mirror M8 to illuminate the reference grating plate 22 in a direction opposite to the regularly reflected beam LB10. The interference beat beam of a ± third-order beam produced by the regularly reflected beams LB10 and LB20 and the reference grating plate 22 is received by the photo-electric element 24, thereby providing the reference signal DR1.

In the fourth embodiment, the beam splitters BSa and BSb and the mirrors M3–M6 correspond to a projecting optical system in the present invention, and the beams LB1 and LB2 incident on the respective mirrors M1 and M2 are collimated beams each having an appropriate diameter.

The system shown in FIG. 9 is integrally secured in position in one box and is not easily influenced by the fluctuation of air. Since this structure makes it possible to achieve a compact arrangement using no lens system, it can also be used as a reading head or the like in an optical linear encoder, a rotary encoder or the like.

In the fourth embodiment as well, the beams LB1 and LB2 may be polarized, whether identically or complementarily. In the case of complementary polarization, as shown in FIG. 7, a phase plate (inclined in the 45° direction) may be disposed in front of each of the photo-electric elements 19 and 24 so as to effect conversion into interference beat beams.

In addition, quarter wavelength plates may be disposed between the beam splitters BSa, BSb and the mirrors M5, M6, respectively. If the beams LB1 and LB2 incident on the respective mirrors M1 and M2 are linearly polarized (for example, S-polarized) by utilizing the beam splitters BSa and BSb, the directions of polarization of the regularly polarized beams LB10 and LB20 are respectively changed into the directions of polarization perpendicular to the original beams LB1 and LB2 at the corresponding splitters BSa and BSb. Accordingly, it is possible to improve the efficiency of utilization of a laser beam and also to prevent back talk to a laser source or the like.

If a modular illuminating means in which an optical-IC semiconductor laser is combined with a semiconductor laser is provided integrally with the system of FIG. 9 and the beams LB1 and LB2 are produced from such an integral arrangement, the entire arrangement can be made extremely compact.

In general, the wavelength of a semiconductor laser is distributed between infrared and red. If the oscillation frequency of a laser is on the order of 900 nm and n = 3 and $\lambda = 0.9$ μm for sin $\theta = n\lambda/P$, the angle of incidence of each beam LB1 and LB2 on the grating mark GM is approximately 26.74 degrees. In addition, since n = 3, that is, since the interference beat beam of the third-order beam is used, measurement sensitivity (resolution) is three times as high as that obtained by using the interference beat beam of the ± first-order light.

In other words, $\pm \frac{1}{2}$ of a grating pitch of 6 μm- = 1.5 μm- corresponds to a phase difference of ±180°, and further $\pm \frac{1}{2}$ corresponds to a phase difference of ±180°. Accordingly, if the resolution of a phase-difference measurement device is 1°, a sensitivity of ±0.0083 μm is obtained.

Figure 10A:
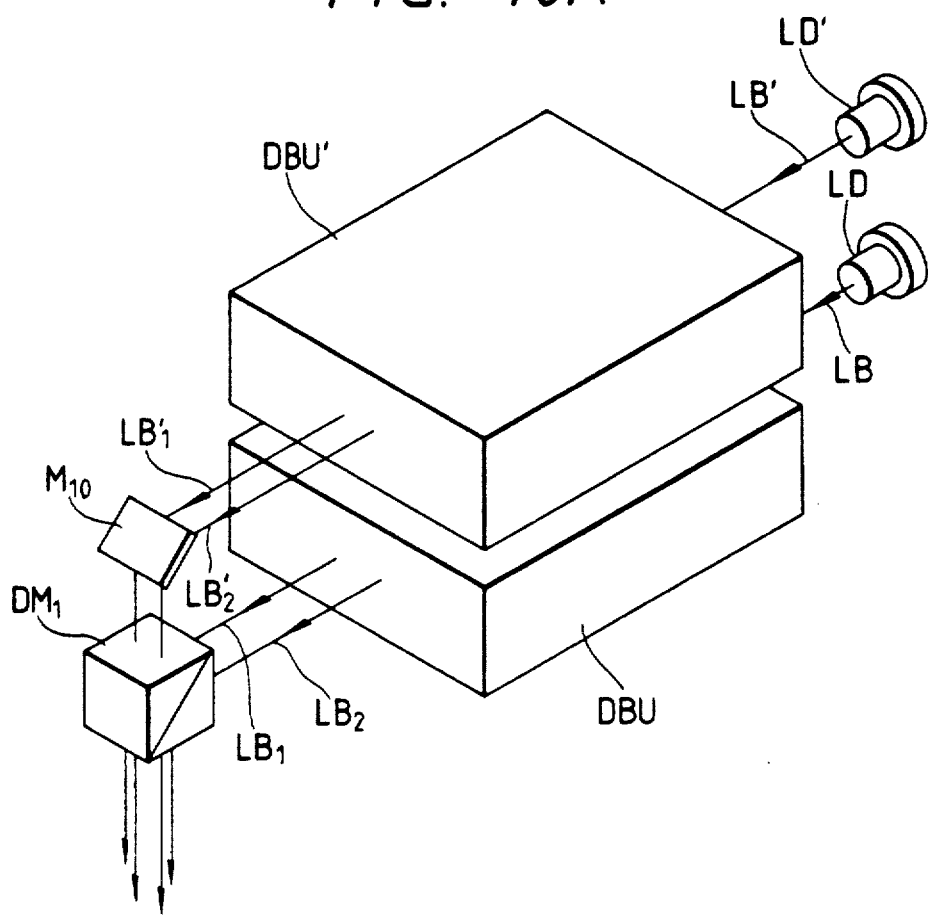
FIG. 10A is a schematic perspective view showing the arrangement of the beam transmission system incorporated in a position detecting device according to a fifth embodiment of the present invention.

It is customary to detect the grating mark GM on the wafer W through a 1–2 μm-thick resist layer in an exposure process. The beams LB1 and LB2 which are used in such detection are single-color layer beams having strong coherency and are easily influenced by the interference between light reflected from the surface of the resist layer and light reflected from the wafer surface, variation in the phase of diffracted light, and the like. To cope with this problem, as shown in FIG. 10A, a laser source LD having an oscillation wavelength of approximately 600 nm and a laser source LD' having an oscillation wavelength of approximately 800 nm are prepared, and beams LB and LB' produced by the respective laser sources LD and LD' are made incident on the beam frequency shifter DBU and a beam frequency shifter DBU'.

The shifter DBU produces a pair of beams LB1 and LB2 between which there is a frequency difference $\Delta fD$ and emits this pair of beams LB1 and LB2 toward a dichroic mirror DM1. The shifter DBU' produces a pair of beams LB1' and LB2' between which there is a frequency difference $\Delta f$ and emits this pair of beams LB1' and LB2' toward the dichroic mirror DM1, thereby combining the beams LB1' and LB2' with the beams LB1 and LB2, respectively.

Figure 10B:
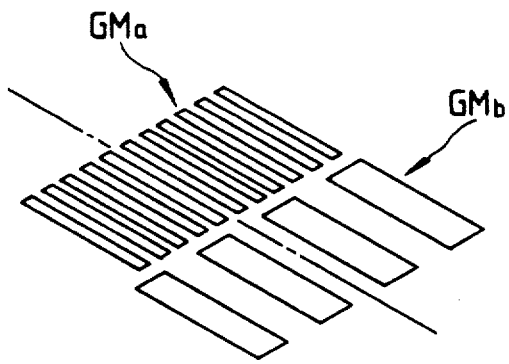
FIG. 10B is a perspective view showing the configuration of a mark suitable for use in the fifth embodiment.

As shown in FIG. 10B, a mark on a wafer may be formed as one set of grating marks GMa and GMb having different pitches. With this set of grating marks GMa and GMb, it is possible to cause the common photo-electric element 19 to receive a measurement-purpose interference beat beam and also to make the angles of incidence of the beams LB1 and LB2 on the respective grating marks GMa and GMb coincide with the angles of incidence of the beams LB1' and LB2'.

In such a case, the following relationship is obtained:

$$\sin \theta = \frac{3 \cdot \lambda_1}{Pb} = \frac{\lambda_2}{Pa}$$

where the angles $\theta$ of incidence are common. Pa represents the pitch of the grating mark GMa, Pb represents the pitch of the grating mark GMb, $\lambda_1$ (600 nm) represents the wavelength of the beam LB, $\lambda_2$ (800 nm) represents the wavelength of the beam LB', the interference beat beam of a first-order (n=1) diffracted beam is detected using the wavelength $\lambda_2$ ($\lambda_1 > \lambda_2$) with respect to the grating mark GMa, and the interference beat beam of a third-order (n=3) diffracted beam is detected using the wavelength $\lambda_1$ with respect to the grating mark GMb.

Accordingly, if $\lambda_1 = 600$ nm and $\lambda_2 = 800$ nm, the ratio of Pa:Pb is 4:9, whereby the pitches Pa and Pb can be made 4 $\mu$m and 9 $\mu$m.

In this case, the angle of incidence of each beam LB1, LB1' or each beam LB2, LB2' is approximately 11.54 degrees. If the pitch Pa is 2 $\mu$m and the pitch Pb is 4.5 $\mu$m, the angle of incidence is approximately 23.58 degrees.

In the above-described arrangement, the influences of resist layers differ from each other owing to the fact that the pitches of the grating marks GMa and GMb differ from each other, the wavelengths $\lambda_1$ and $\lambda_2$ greatly differ from each other, and so on. Accordingly, it is possible to achieve high-accuracy detection by using as a measurement signal a interference beat beam which is relatively not influenced or by using both measurement signals. Illumination with the beams LB1 and LB2 and illumination with the beams LB1' and LB2' may be switched sequentially in time, or two photoelectric elements 19 may be prepared and illuminated at the same time by interference beat beams which are wavelength-separated by means of a dichroic mirror. Since the two wavelengths $\lambda_1$ and $\lambda_2$ return the same beat transmitting paths, respectively, two kinds of diffraction gratings such as those shown in FIG. 10B are formed on the reference grating plate 22 so that reference signals can be produced for the regularly reflected beams LB10 and LB20, respectively.

In addition, in the arrangement shown in FIGS. 10A and 10B, if Pa=4 $\mu$m and Pb=9 $\mu$m, the resolution of the mark GMa which can be detected with the beams LB1' and LB2' (wavelength $\lambda_2$) is $\pm 180°$ per $\pm 1$ $\mu$m (Pa/4), and the resolution of the mark GMb which can be detected with the beams LB1 and LB2 (wavelength $\lambda_2$) $\pm 180°$ per $\pm \frac{9}{4}\mu$m ($\frac{1}{4} \times$ Pb/4).

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An alignment apparatus comprising:
   beam supplying means for supplying a pair of coherent radiation beams which intersect each other at a predetermined angle on a diffraction grating formed on a substrate;
   first beam receiving means arranged to receive an interference beam, which is produced from radiation of said pair of beams diffracted at said diffraction grating, and then to produce a corresponding output;
   second beam receiving means arranged to receive an interference beam which is produced from radiation of one of said pair of beams regularly reflected by said substrate and radiation of the other of said pair of beams regularly reflected by said substrate, and then to produce a corresponding output; and
   means for forming information on the position of said substrate on the basis of the output of said first beam receiving means and the output of said second beam receiving means.

2. An alignment apparatus according to claim 1, wherein said information forming means comprises means for outputting a detection signal corresponding to a displacement of said substrate with respect to a predetermined reference point by comparing the output of said first beam receiving means with the output of said second beam receiving means.

3. An alignment apparatus according to claim 2, further comprising moving beams for varying the relative position between said substrate and an object on the basis of said detection signal.

4. An alignment apparatus according to claim 1, wherein said second beam receiving means includes a reference diffraction grating and means for causing said one and said other of said beams regularly reflected at said substrate to intersect each other on said reference diffraction grating, said second beam receiving means being arranged to receive an interference beam resulting from diffraction produced at said reference diffraction grating by said one and other regularly reflected beams.

5. An alignment apparatus according to claim 1, wherein said pair of beams supplied from said beam supplying means has a predetermined frequency difference therebetween.

6. An alignment apparatus according to claim 1, wherein said first beam receiving means receives an interference beam including interference fringes produced at said diffraction grating.

7. An alignment apparatus according to claim 1, wherein said first beam receiving means receives an interference beam including interference fringes produced by means that receives a pair of beams diffracted from said diffraction grating.

8. An alignment apparatus according to claim 1, wherein said first beam receiving means receives an interference beam diffracted from said diffraction grating along a direction substantially perpendicular to said diffraction grating.

9. An alignment apparatus according to claim 1, further comprising means for preventing the interference beam received by said second beam receiving means from reaching said first beam receiving means, and means for preventing the interference beam received by said first receiving means from reaching said second beam receiving means.

10. An alignment apparatus according to claim 1, wherein the pair of radiation beams and the interference beams received by said first and second beam receiving means travel along air paths disposed so that the outputs of both said beam receiving means are influenced by substantially the same air fluctuations.

11. An alignment apparatus according to claim 1, wherein said beam supplying means includes a projection optical system through which said pair of coherent radiation beams passes to said diffraction grating and through which said interference beams pass from said diffraction grating.

* * * * *